(12) United States Patent
McEachern et al.

(10) Patent No.: US 6,759,765 B2
(45) Date of Patent: Jul. 6, 2004

(54) SAG GENERATOR WITH PLURALITY OF SWITCH TECHNOLOGIES

(75) Inventors: Alexander McEachern, Oakland, CA (US); Barry Tangney, San Leandro, CA (US)

(73) Assignee: Power Standards Lab, Emeryville, CA (US)

( * ) Notice: Subject to any disclaimer, the term of this patent is extended or adjusted under 35 U.S.C. 154(b) by 195 days.

(21) Appl. No.: 10/167,568

(22) Filed: Jun. 12, 2002

(65) Prior Publication Data

US 2003/0230937 A1 Dec. 18, 2003

(51) Int. Cl.[7] ................................................. H02J 3/12
(52) U.S. Cl. ....................................................... 307/103
(58) Field of Search ................................ 307/103, 130, 307/17; 323/209, 211, 205, 210

(56) References Cited

U.S. PATENT DOCUMENTS

| | | | |
|---|---|---|---|
| 4,131,938 A | 12/1978 | Milberger et al. | 363/101 |
| 5,886,429 A | 3/1999 | Grady et al. | 307/125 |
| 5,920,132 A | 7/1999 | Rockfield, Jr. et al. | 307/130 |
| 5,990,667 A | 11/1999 | Degeneff et al. | 323/258 |
| 6,285,169 B1 | 9/2001 | McEachern | 323/209 |

OTHER PUBLICATIONS

SEMI F47–0200, *Specification for semiconductor processing equipment, Voltage sag immunity*, SEMI (Semiconductor Equipment and Materials International, 805 East Middlefield Raod, Mountain View, CA 94043), Feb. 2000.

SEMI F42–0600, *Test method for semiconductor processing equipment, Voltage sag immunity*, SEMI (Semiconductor Equipment and Materials International, 805 East Middlefield Raod, Mountain View, CA 94043), Jun. 2000.

*Primary Examiner*—Pia Tibbits

(57) ABSTRACT

A voltage sag generator for alternating current power systems intentionally creates power quality disturbances. The sag generator combines different switching technologies to optimize power dissipation and transition performance.

1 Claim, 5 Drawing Sheets

SAG GENERATOR WITH PLURALITY OF SWITCH TECHNOLOGIES

CROSS REFERENCES TO RELATED APPLICATIONS

None.

BACKGROUND—FIELD OF THE INVENTION

This invention relates to electric power test equipment, more specifically to sag generators that intentionally create power quality disturbances on an alternating current system.

BACKGROUND OF THE INVENTION

It is often desirable to create power quality disturbances on alternating current systems. Such disturbances can be used, for example, to test the immunity of newly designed systems. For example, the SEMI-F47 standard, published by the industry association Semiconductor Equipment and Materials International, and the associated SEMI-F42-0600 testing standard, require that all semiconductor manufacturing equipment tolerate voltage sags to 50% of nominal for 200 milliseconds, to 70% of nominal for 500 milliseconds, and to 80% of nominal for 1 second.

Devices that generate such sags for testing purposes are known as sag generators.

Sag generators are often used to test large, room-sized systems that cannot be readily transported to another location, such as semiconductor manufacturing systems. The sag generator must generally be transported to the system to be tested. For this reason, a key element in sag generator design is portability.

It is well known to those familiar with the art that dissipating large amounts of heat is difficult in a portable instrument. Consequently, minimizing heat losses in sag generators is a desirable goal.

Transformer-based sag generators are well-known in the art. Grady et al. in U.S. Pat. No. 5,886,429 and Rockfield et al. in U.S. Pat. No. 5,920,132 disclose typical transformer-based sag generators. In a transformer-based sag generator, switching devices are used to change from a non-sagged voltage, typically the input voltage, to a sagged voltage, typically a tap on the transformer. After a brief interval of time, typically limited to a few seconds, the switching devices change back to the non-sagged voltage.

Sag generators are rated by their nominal voltage and their maximum continuous current, for example 480 volts and 100 amps. The characteristics of the switching devices often determine the performance, and set the limits, for the sag generator as a whole. In particular, the heat losses in the switching devices are a critical factor.

These switching devices may be mechanical switches, such as contactors or relays; or solid state switches, such as triacs or insulated gate bipolar transistors. Each type of switching device has its advantages and disadvantages.

Mechanical switching devices, such as contactors or relays, generate minimal heat losses. Typical forward voltage drop across the switch is roughly 0.2 volts, which corresponds to 20 watts of heat at 100 amps. However, this type of switch cannot be easily used to control the phase angle at which the transition to a voltage sag takes place. In addition, this type of switch can introduce unintended transient conditions during transition from one state to another, due to physical movement of the switch contacts.

Triac switching devices generate more heat losses than mechanical switching devices. Typical forward voltage drop across the switch is roughly 1.7 volts, which corresponds to 170 watts of heat at 100 amps. In addition, they limit the phase angle control for sag transitions to 0° or 180° on the current waveform.

IGBT (insulated gate bipolar transistor) switching devices generate even more heat losses than triac switching devices. Depending on the configuration, the forward voltage drop across the switch can range up to 5 volts, which corresponds to 500 watts of heat at 100 amps. On the other hand, IGBT switching devices permit accurate phase control and minimal switching transitions.

OBJECTS AND ADVANTAGES

It is an object of this invention to provide a tranformer-based sag generator that combines the advantages of two or more switch technologies, while avoiding the disadvantages of those switch technologies.

It is a further object of this invention to provide a sag generator that allows automatic control of the sag depth, sag duration, sag envelope, and sag phase angle.

Still further objects and advantages will become apparent from a consideration of the ensuing description and accompanying drawings.

PREFERRED EMBODIMENT—DESCRIPTION

Figure 1:
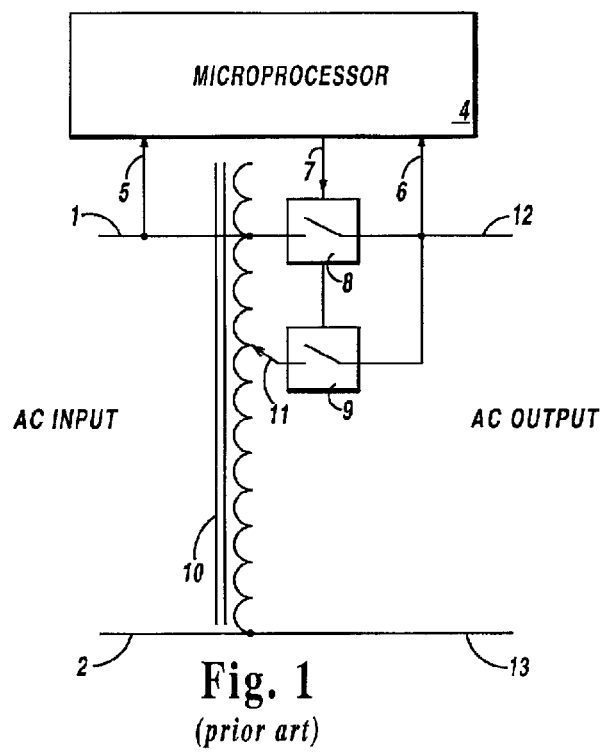
FIG. 1 shows a prior-art sag generator, constructed with a variable transformer.

Turning first to FIG. 1, we see a prior art sag generator. An alternating current input 1,2 is modified by a variable transformer 10 controlled by a microprocessor 4 to produce a sagged alternating current output 12,13. The variable transformer 10 is constructed as an auto-transformer with a tap comprised of a manually-controlled wiper 11, such as the well-known Variac transformer manufactured by Superior Electric, Chicago, Ill. The microprocessor 4 may be equipped with analog inputs 5,6 for measuring the input and output voltages. The microprocessor is equipped with digital outputs 7 that control alternating current switches 8,9. These switches may be electro-mechanical relays or contactors, IGBT's (insulated gate bipolar transistors) such as the 1°

M.BI300 manufactured by Fuji Semiconductor of Carrollton, Tex., or triac switches such as the H12D4850 solid-state relay manufactured by Crydom, San Diego, Calif. In operation of this prior-art sag generator, the user manually sets the position of the transformer wiper 11 to the desired sag voltage. The microprocessor 4 activates one switch 8 to provide non-sagged power to a load connected to the alternating current output 12,13. When a sag is desired, the microprocessor 4 opens one switch 8 and closes the other switch 9 for the duration of the desired sag. Such a duration might be determined, for example, by counting the number of alternating current cycles through one of the analog inputs 5,6. At the conclusion of the desired sag, the microprocessor opens the sag switch 9 and closes the non-sagged switch 8.

Figure 2:
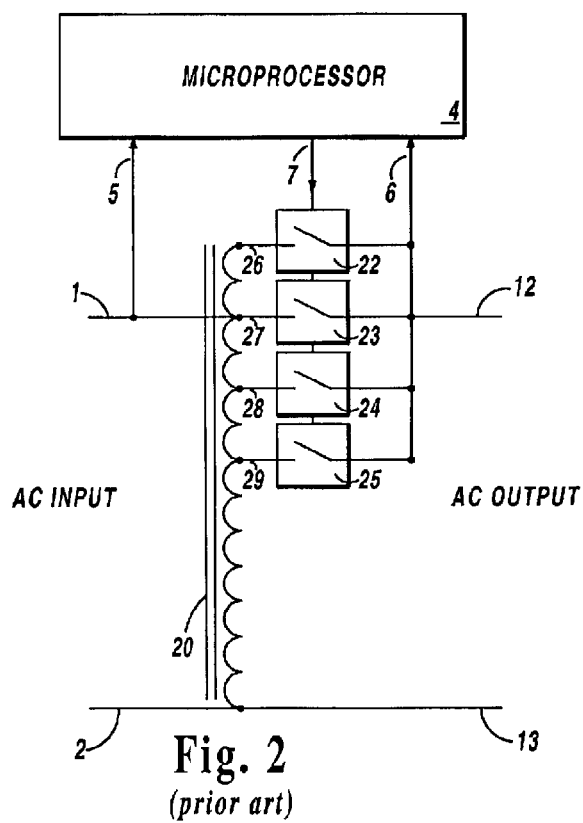
FIG. 2 shows a prior-art sag generator, constructed with a tap-switched transformer.

Turning now to FIG. 2, we see another prior-art transformer-based sag generator. An alternating current input 1,2 is modified by a multiple-tap auto-transformer 20 equipped with multiple taps 26,27,28,29 controlled by a microprocessor 4 to produce a sagged alternating current output 12,13. The microprocessor 4 may be equipped with analog inputs 5,6 for measuring the input and output voltages. The microprocessor is equipped with digital outputs 7 that control alternating current switches 22,23,24,25. These switches may be electro-mechanical relays or contactors, IGBT's (insulated gate bipolar transistors) such as the 1MBI300 manufactured by Fuji Semiconductor of Carrollton, Tex., or triac switches such as the H12D4850 solid-state relay manufactured by Crydom, San Diego, Calif. In operation of this prior-art sag generator, the microprocessor 4 activates one switch 23 to provide non-sagged power to the load connected to the alternating current output 12,13. When a sag is desired, the microprocessor 4 opens one switch 23 and closes one of the other switches 22,24,25 for the duration of the desired sag. Such a duration might be determined, for example, by counting the number of alternating current cycles through one of the analog inputs 5, 6. At the conclusion of the desired sag, the microprocessor opens the selected sag switch 22,24,25 and closes the non-sagged switch 23. One familiar with the art will note that the prior-art sag generator shown in FIG. 2 is capable of generating negative sags, also known as voltage swells, using a transformer tap 26 that is higher than the nominal voltage tap 27. One familiar with the art will also note that, in contrast with the prior-art configuration of FIG. 1, the prior-art configuration of FIG. 2 provides computer-controlled selection of the output voltage, but provides limited sag depth resolution.

It will be apparent to one familiar with the art that the switches 8,9 of FIG. 1 and the switches 22,23,24,25 of FIG. 2 are a key design problem: if electromechanical, they will introduce difficult switching transitions in the output 12; and if solid state, they will generate substantial amounts of heat—on the order of hundreds of watts for a 100-amp sag generator—that makes the design of a portable sag generator difficult, expensive, and less reliable.

Figure 3:
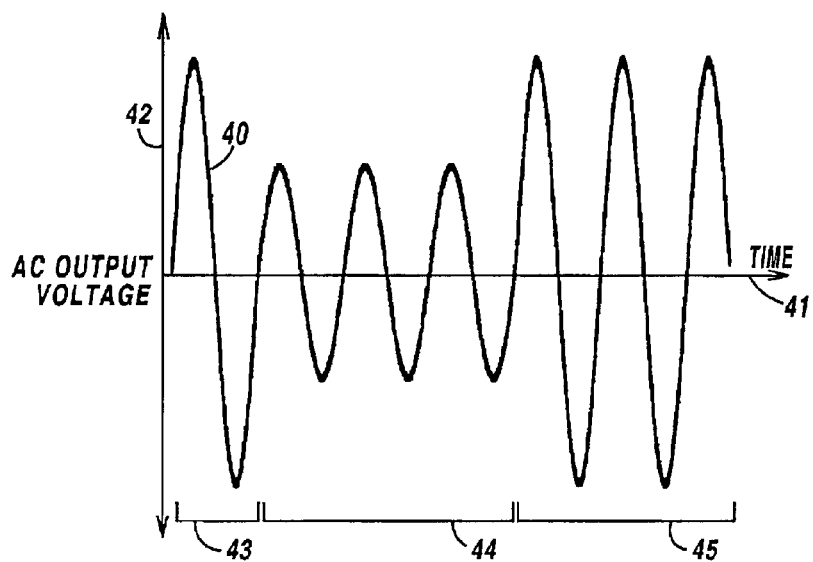
FIG. 3 shows a typical voltage sag waveform.

Turning now to FIG. 3, we see a typical desired output of a sag generator, presented as a voltage waveform 40 graphed on a horizontal time axis 41 and a vertical alternating current output voltage axis 42. During an initial time interval 43, the waveform shows nominal voltage. During a sag time interval 44, the waveform shows the sag voltage, in this case 50% of nominal for 3 cycles. The voltage returns to nominal in the post-sag interval 45.

Figure 4:
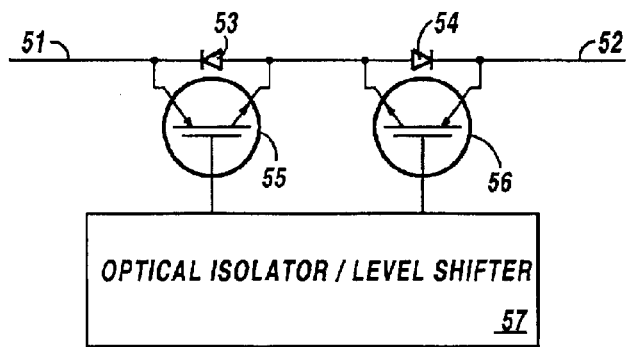
FIG. 4 shows a prior-art alternating current switch technology, back-to-back IGBT's (insulated gate bipolar transistors).

Turning now to FIG. 4, we see a prior-art solid-state alternating current switch, with back-to-back IGBT's 55,56 (insulated gate bipolar transistors). This switch could be used to perform the function of any of the switches 8,9,22, 23,24,25 shown in FIG. 1 and FIG. 2. The input 51 of the switch is connected to the output 52 of the switch, for alternating current, when the logic input 59 is activated. Steering diodes 53,54 ensure that the correct IGBT 55,56 is forward biased regardless of the polarity of the current. An optical isolator and level shifter 57 converts and isolates the logic-level signal.

It will be apparent to one familiar with the art that the voltage drop across the switch in FIG. 4 is the sum of the voltage drop across one diode 53,54 plus the voltage drop across one IGBT 55,56. At 100 amps, the diode voltage drop is approximately 1 volt, and the IGBT voltage drop is approximately 3 volts, so the sum is approximately 4 volts, and the power dissipation is approximately 400 watts.

Figure 5:
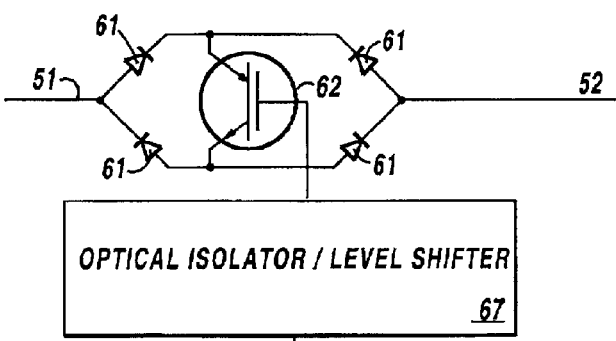
FIG. 5 shows a prior-art alternating current switch technology, a bridge-configured IGBT (insulated gate bipolar transistor).

Turning now to FIG. 5, we see a prior-art solid-state alternating current switch, with a bridge-configured IGBT 62 (insulated gate bipolar transistor). This switch could also be used to perform the function of any of the switches 8,9,22,23,24,25 shown in FIG. 1 and FIG. 2. The input 51 of the switch is connected to the output 52 of the switch, for alternating current, when the logic input 59 is activated. A bridge comprised of four diodes 61 ensures that the IGBT 62 is forward biased regardless of the polarity of the current. An optical isolator and level shifter 67 converts and isolates the logic-level signal.

It will be apparent to one familiar with the art that the voltage drop across the switch in FIG. 5 is the sum of the voltage drop across two diodes 61 plus the voltage drop across the IGBT 62. At 100 amps, each diode voltage drop is approximately 1 volt, and the IGBT voltage drop is approximately 3 volts, so the sum is approximately 5 volts, and the power dissipation is approximately 500 watts.

Figure 6:
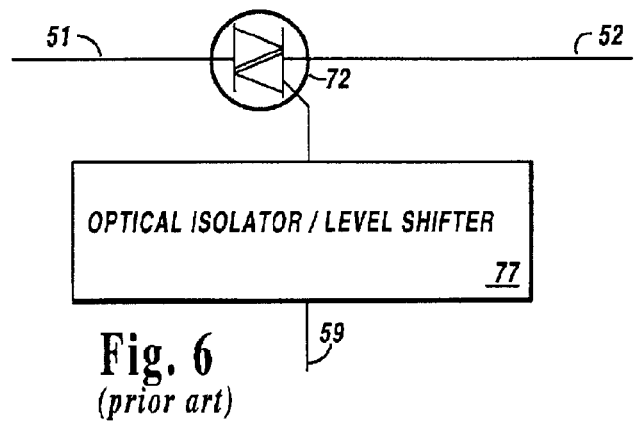
FIG. 6 shows a prior-art alternating current switch technology, a triac.

Turning now to FIG. 6, we see a prior-art solid-state alternating current switch, with a triac 72. This switch could also be used to perform the function of any of the switches 8,9,22,23,24,25 shown in FIG. 1 and FIG. 2. The input 51 of the switch is connected to the output 52 of the switch, for alternating current, when the logic input 59 is activated. An optical isolator and level shifter 77 converts and isolates the logic-level signal.

It will be apparent to one familiar with the art that the voltage drop across the switch in FIG. 6 is the voltage drop across the triac 72. At 100 amps, the voltage drop is approximately 1.7 volts, the power dissipation is approximately 170 watts. It will also be apparent to one familiar with the art that the triac 72 will turn off only at current zero-crossings, limiting the phase angles at which the switch may be operated, and at which a sag may be generated by the sag generator.

Figure 7:
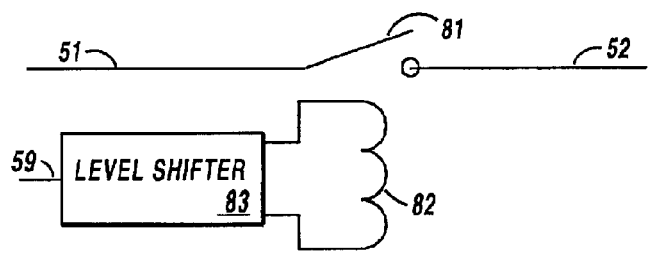
FIG. 7 shows a prior-art alternating current switch technology, an electromechanical relay or contactor.

Turning now to FIG. 7, we see a prior-art electromechanical switch comprised of an electromagnetic coil 82 and a pair of contacts 81. This switch could also be used to perform the function of any of the switches 8,9,22,23,24,25 shown in FIG. 1 and FIG. 2. The input 51 of the switch is connected to the output 52 of the switch, for alternating current, when the logic input 59 is activated. A driver 83 amplifies the logic signal.

It will be apparent to one familiar with the art that the voltage drop across the switch in FIG. 7 is approximately 0.2 volts at 100 amps, giving a power dissipation of 20 watts. It will also be apparent to one familiar with the art that the switch of FIG. 7 has substantial and unpredictable transition time, making it difficult to produce a glitch-free output and impossible to control the phase angle of the sag.

PREFERRED EMBODIMENT—OPERATION

Figure 8:
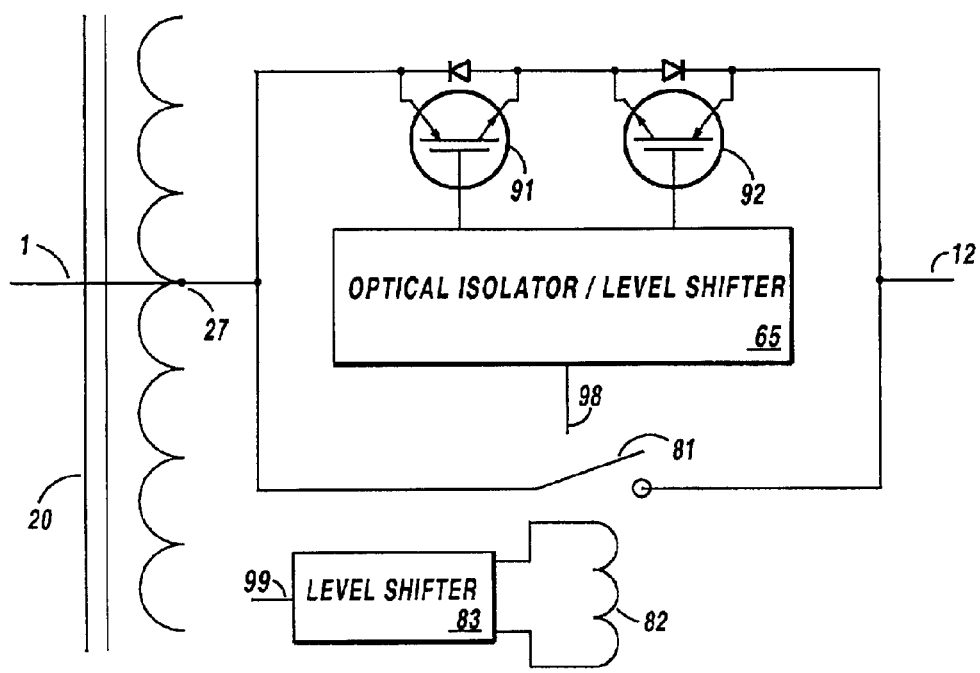
FIG. 8 shows a detail of one embodiment of the present invention, drawn in such a way as to conveniently contrast with prior art shown in FIG. 4, FIG. 5, FIG. 6, and FIG. 7.
Figure 9:
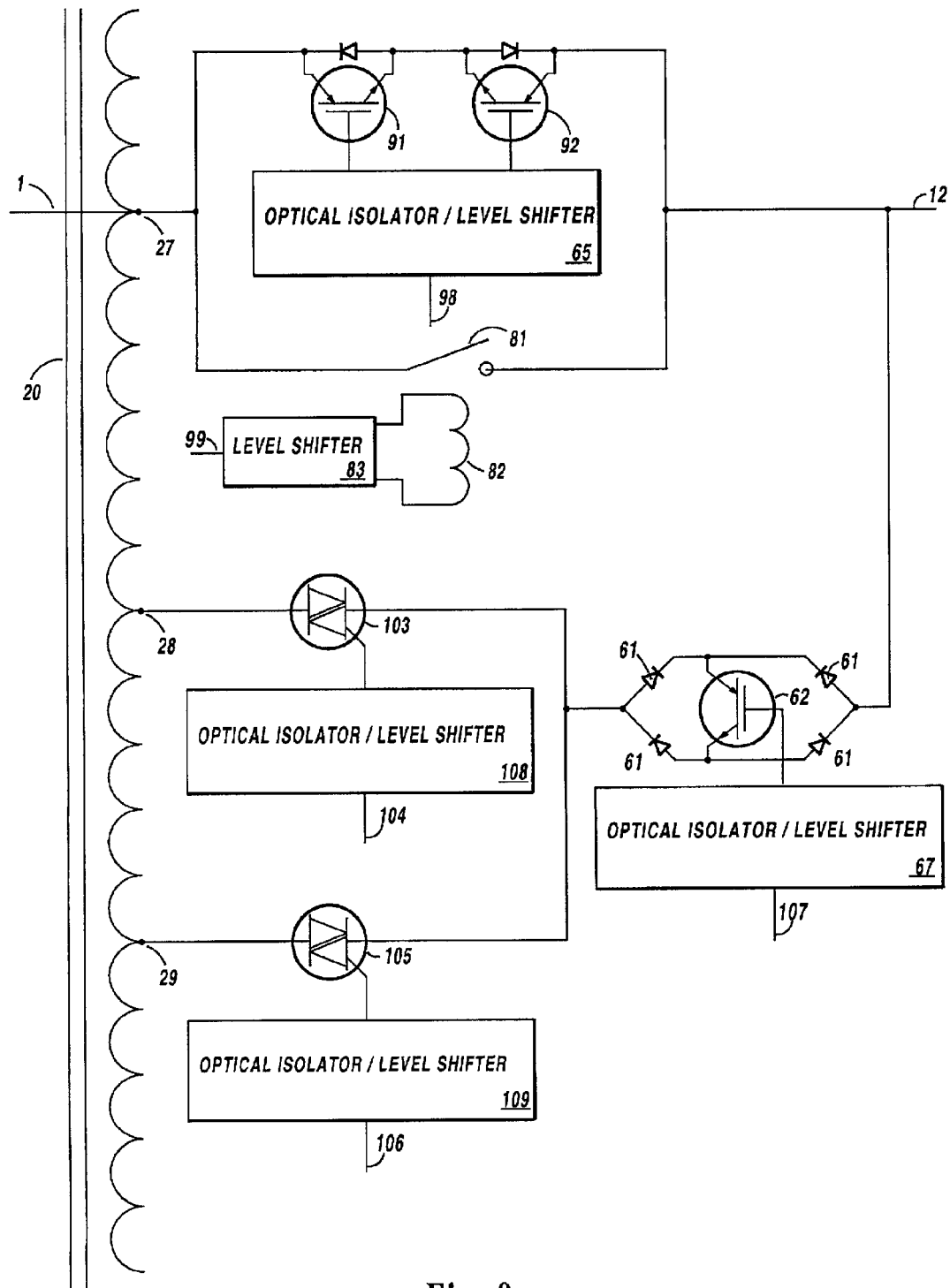
FIG. 9 shows an embodiment of the present invention.
Figure 10:
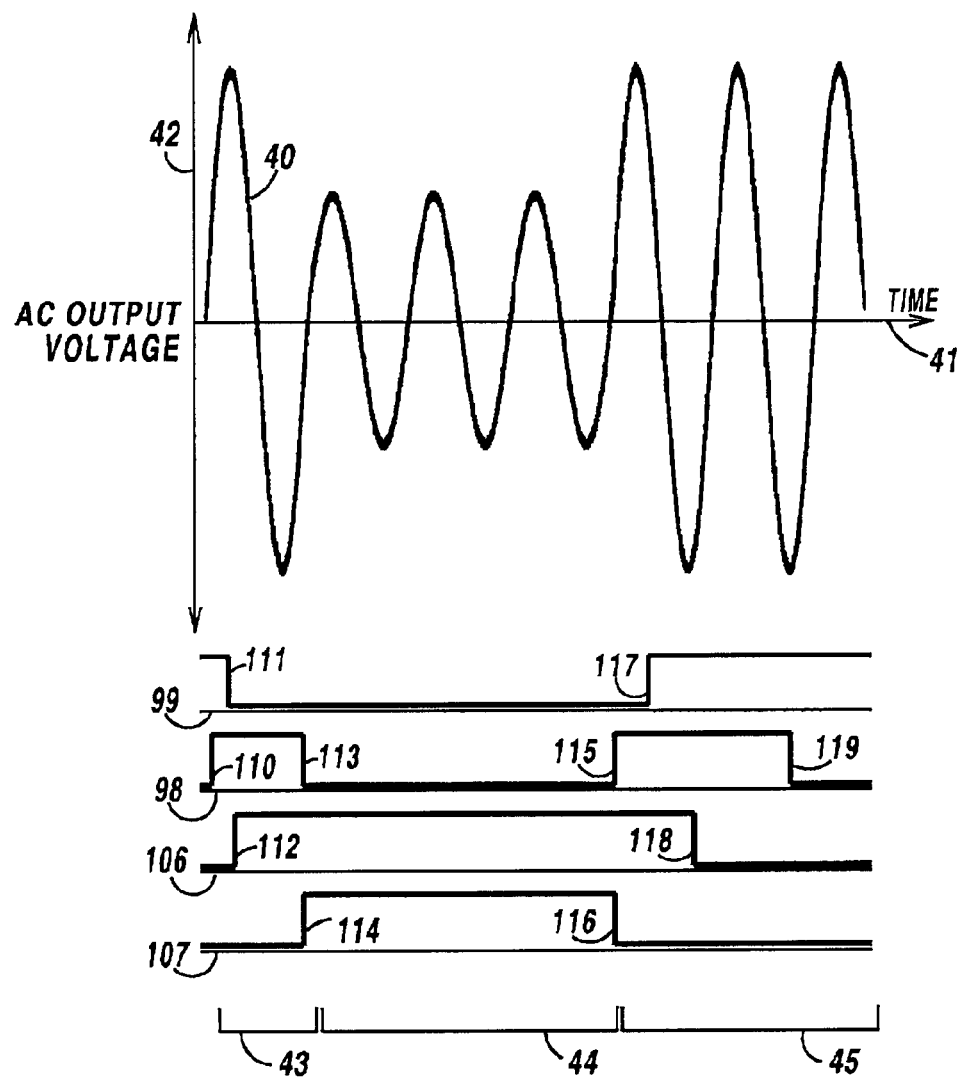
FIG. 10 shows the timing of various signals shown in FIG. 9, drawn in such a way as to associate them with the voltage sag waveform of FIG. 4.

The preferred embodiment of the present invention is shown in FIG. 8, FIG. 9, and FIG. 10.

Turning our attention first to FIG. 8, we see a detail of the present invention. We see elements 1,12,20,27 of the prior art sag generator of FIG. 2. One switch 23 of the prior art sag generator of FIG. 2, which connects the nominal voltage tap 27 of the transformer 20 to the output 12, has been replaced in FIG. 8 with a pair of parallel switches. One of these parallel switches incorporates elements 91,92,65 of the prior art back-to-back IGBT switch of FIG. 4, and the other of these parallel switches incorporates elements 99,81,82,83 of the prior art electromechanical switch of FIG. 7.

Either, both, or neither of these parallel switches may be closed or opened using logic signals 98,99 as described above in the discussion of FIG. 4 and FIG. 7.

It will be recognized by one familiar with the art that when both of these parallel switches are closed, the voltage drop across the electromechanical switch contacts 81 is sufficiently low that no current will flow through the IGBT's 91,92. In this case, the power dissipation will be the very low value determined by the electromechanical switch contacts 81.

Continuing to examine FIG. 8, we consider what happens when a transition is made from the state in which both of these parallel switches are closed, to the state in which the electromechanical switch contacts 81 are open and the switch formed by the IGBT's 91,92 remains closed. The output 12 continues to be connected to the transformer tap 27, but now the current is controlled by the IGBT's 91,92. In this state, the power dissipation increases as considered in the discussion of FIG. 4, but we can now control the timing of the switch operation as considered in the discussion of FIG. 4. If the duration of this new state is brief, the heat from the increased power dissipation can be readily dealt with. As we noted in the discussion of the background of the invention, typical durations for voltage sags generated by voltage sag generators are typically limited to a few seconds.

With this in mind, we turn our attention to FIG. 9 and FIG. 10, which show the preferred embodiment of the present invention.

Examining FIG. 9, we see elements 1,12,20,27,28,29 of the prior art sag generator of FIG. 2. Three switches 23,24, 25 of the prior art sag generator of FIG. 2, have been replaced in FIG. 8 with a more complex arrangement of series and parallel switches.

Examining FIG. 9, we see one switch 23 of the prior art sag generator of FIG. 2 has been replaced by the paralleled electromechanical switch 81 and IGBT switch 91,92 as considered in the discussion of FIG. 8.

Continuing to examine FIG. 9, we see two more switches 24, 25 of the prior art sag generator of FIG. 2 have been replaced with triac switches 103,105 and their associated isolators/level shifters 108,109, the characteristics of which were considered in the discussion of FIG. 6, in series with a bridge-configured 61 IGBT switch 62 the characteristics of which was considered in the discussion of FIG. 5.

Continuing to examine FIG. 8, we see the coil 82 of the electromechanical switch contacts 81 is controlled by a logic signal 99 through a level shifter 83 which drives its coil 82. The triac switches 103, 105 are controlled by logic signals 104, 106 through optical isolator/level shifters 108, 109. We further see that the bridge-configured 61 IGBT switch 62 is controlled by a logic signal 107 through an optical isolator/ level shifter 107. We now conclude that the current path from the various taps 27,28,29 on the transformer 20 to the sag generator output 12 can be routed through any of the available switches by controlling logic signals. This control of logic signals can be accomplished, for example, through the prior-art microprocessor 4 of FIG. 2. The method for generating the logic signals is not critical to the present invention. It will be familiar to one familiar with the art, and has therefore been omitted from the drawing for clarity.

Turning our attention now to FIG. 10, we see the AC output voltage 40 of a typical voltage sag graphed on a vertical axis 42 with respect to time 41, drawn in a way to expand the information shown in FIG. 3. In FIG. 10 we can also see the state of the important logic signals 98,99,106, 107 of FIG. 9. The graph of FIG. 10 shows the state of these signals during an interval 43 before the sag, during the sag interval 44, and during an interval 45 after the sag.

Examining both FIG. 9 and FIG. 10, we observe that the logic signal 99 that controls the electro-mechanical contacts is high prior to the voltage sag, and also high at the conclusion of the voltage sag. From this observation we conclude that during any non-sagged interval, all current flows through the electro-mechanical contacts 81, and that therefore the power dissipation is minimal during non-sagged intervals.

We continue to examine both FIG. 9 and FIG. 10. Prior to commencing a sag, the logic signal 98 that drives the IGBT switch 91,92 that is in parallel with the electromechanical contacts 81 is activated 110. A short time later, the logic signal 99 that controls the electromechanical contacts is deactivated 111, transferring current flow to the IGBT switch 91,92 as considered in the discussion of FIG. 8. At roughly the same time, one of the transformer taps 29 is selected by a transition 112 in the control signal 106 of a triac switch 105.

A short time later, a transition 113 in the logic signal 98 that controls the IGBT switch 91,92 and a transition 114 in the logic signal 107 that controls the bridge-configured 61 IGBT switch 62 taken together cause the output 12 of the sag generator to be connected to one of the lower voltage taps 29 on the transformer 20, creating the transition to the voltage sag interval 44.

Continuing to inspect FIG. 9 and FIG. 10, we note that these two transitions taken together 113,114 both control IGBT switches 91,92,62, so the transition in the sagged output waveform 40 is seamless and phase-controlled. At the conclusion of the sag interval 44, complementary transitions 115,116 in logic signals 98,107 restore the voltage 40 on the output 12 to its full value. A non-timing-critical transition 118 in the logic signal 106 that selects the transformer tap de-selects that tap. Subsequently, transitions 117,119 in two other logic signals 99,98 transfer the current back to electromechanical contacts 81, immediately reducing the power dissipation.

We conclude our examination of the preferred embodiment shown in FIG. 9 and FIG. 10 by noting that it provides the minimal power dissipation of electromechanical contacts discussed in FIG. 7, at the same time providing the phase control and clean transitions of the solid-state switches discussed in FIG. 4, FIG. 5, and FIG. 6.

Other Embodiments

It will be apparent to one familiar with the art that other useful embodiments of the invention are possible. Any prior-art switch technology may be substituted for the any of the switch technologies disclosed in the preferred embodiment. The bridge-configured 61 IGBT switch 62 of FIG. 9 may be omitted if the triac switches 103,105 of FIG. 9 are replaced with IGBT switches. Various other modifications may be made to the preferred embodiment without departing from the spirit and scope of the invention as defined by the appended claims.

We claim:

1. An apparatus for creating voltage sags on an alternating current power system, said apparatus comprising:

a. an input means capable of supplying alternating current voltage;

b. a transformer means capable of being connected to the input means, such transformer means equipped with at least one voltage tap;

c. an output means capable of delivering alternating current voltage;

d. a plurality of switching means, at least one such switching means capable of connecting the output means to the input means, and at least one other such switching means capable of connecting the output means to the voltage tap;

e. the switching means capable of connecting the output means to the input means comprising at least two switches connected in parallel or in series, such switches comprised of at least two differing technologies.

* * * * *